(12) United States Patent
Chappell et al.

(10) Patent No.: US 8,558,552 B2
(45) Date of Patent: Oct. 15, 2013

(54) HOME NETWORK CHARACTERIZATION METHOD AND SYSTEM

(75) Inventors: Daniel K. Chappell, Greenwood, IN (US); Richard Earl Jones, Jr., Plainfield, IN (US); Eddie B. Gaines, Plainfield, IN (US)

(73) Assignee: JDS Uniphase Corporation, Milpitas, CA (US)

( * ) Notice: Subject to any disclaimer, the term of this patent is extended or adjusted under 35 U.S.C. 154(b) by 374 days.

(21) Appl. No.: 12/889,969

(22) Filed: Sep. 24, 2010

(65) Prior Publication Data

US 2012/0074952 A1   Mar. 29, 2012

(51) Int. Cl.
*G01R 31/11*   (2006.01)

(52) U.S. Cl.
USPC ......................................................... 324/534

(58) Field of Classification Search
USPC ......................................................... 324/534
See application file for complete search history.

(56) References Cited

U.S. PATENT DOCUMENTS

| | | | | |
|---|---|---|---|---|
| 5,274,333 | A * | 12/1993 | Ghannouchi et al. | 324/638 |
| 5,754,053 | A * | 5/1998 | Bourdeau | 324/533 |
| 5,773,985 | A * | 6/1998 | Bradley | 324/642 |
| 5,994,905 | A | 11/1999 | Franchville | 324/533 |
| 6,515,485 | B1 * | 2/2003 | Bullock et al. | 324/601 |
| 6,937,944 | B2 | 8/2005 | Furse et al. | 702/58 |
| 7,071,700 | B2 | 7/2006 | Gorka | 324/534 |
| 7,212,008 | B1 | 5/2007 | Barsumian et al. | 324/533 |
| 7,236,338 | B2 | 6/2007 | Hale et al. | 361/42 |
| 7,253,636 | B2 | 8/2007 | Shambaugh, Jr. et al. | 324/534 |
| 7,276,913 | B1 | 10/2007 | Lo et al. | 324/533 |
| 7,337,079 | B2 | 2/2008 | Park et al. | 702/59 |
| 7,414,411 | B2 | 8/2008 | Tan et al. | 324/601 |
| 7,589,535 | B2 | 9/2009 | Gotwals et al. | 324/533 |
| 7,805,265 | B2 * | 9/2010 | Namba et al. | 702/65 |
| 2004/0061508 | A1 * | 4/2004 | Wyar | 324/543 |
| 2006/0182269 | A1 * | 8/2006 | Lo et al. | 379/406.08 |
| 2009/0135732 | A1 | 5/2009 | Maxson | 370/252 |
| 2009/0168972 | A1 * | 7/2009 | Cioffi et al. | 379/1.04 |
| 2010/0052693 | A1 * | 3/2010 | Wang | 324/533 |

OTHER PUBLICATIONS

"CLI-1750/LST-1700 Signal Level, Leakage & Home Wiring Test Kit" http://www.jdsu.com/product-literature/CLI1750LST1700DataSheet.pdf Jul. 2007.

(Continued)

*Primary Examiner* — Jermele M Hollington
*Assistant Examiner* — Demetrius Pretlow
(74) *Attorney, Agent, or Firm* — Matthew A. Pequignot; Pequignot + Myers LLC

(57) ABSTRACT

A method of characterizing a wiring network is implemented in a system which includes a test controller and at least two probes. On commands from the test controller, at least one of the probes changes its impedance between the nominal impedance of the wiring network and a mismatch impedance. Reflectometry measurements are performed before and after of switching the impedance of the second probe. At the first probe, an RF signal is generated and a reflected signal is measured. Then, the impedance of the second probe is changed, and again an RF signal is generated and a reflected signal is measured at the first probe. Additionally, a frequency response may be measured at the second probe. The results of the measurements are used for characterization of a transmission line between the first and second probes.

13 Claims, 11 Drawing Sheets

(56) References Cited

OTHER PUBLICATIONS

"SmartClass™ IW-1000 Inside wiring and Networks Service Meter" http://www.jdsu.com/product-literature/SmartClass__Home__IW-1000__datasheet.pdf Nov. 2008.

"Site Master S311D Cable and Antenna Analyzer, 25 MHz to 1600 MHz" http://www.us.anritsu.com/downloads/files/11410-00419.pdf Anritsu Oct. 2009.

"Distance to Fault Measurements for Cable and Antenna Installation and Maintenance" thttp://www.us.anritsu.com/downloads/files/11410-00373.pdf Anritsu Sep. 2005.

* cited by examiner

HOME NETWORK CHARACTERIZATION METHOD AND SYSTEM

TECHNICAL FIELD

The present invention relates to mapping a cable distribution network, and in particular to the identification and locating of splitters, barrel/splices, low quality splitters and opens in a home wiring network utilizing the results from reflectometry testing.

BACKGROUND OF THE INVENTION

Fault detection, e.g. locating faults such as breaks, shorts, discontinuities, degraded components, and improperly terminated transmission lines, is a task performed by CATV service providers in order to pinpoint problems in the cable distribution network. Faults within the distribution network are typically characterized by an impedance mismatch, i.e. the impedance of the fault is different from the characteristic impedance of the transmission lines of the distribution network. For example, transmission lines in a CATV distribution subsystem typically have an impedance of approximately 75 ohms; however, a short on the transmission line would have an approximately zero impedance and a break would have an approximately infinite impedance.

One problem with faults in the distribution subsystem is that faults, due to their impedance mismatch characteristics, reflect signals transmitted through the distribution network. As a result, faults in the distribution network may also cause problems throughout the distribution network due to interference from reflected signals. Therefore, it is important for CATV service providers to be able to easily identify and locate faults within the network in order to cure reception problems of a single subscriber and to remove fault generated interference from the distribution network as a whole.

Frequency domain reflectometry utilizes a reflectometer that applies a sweep signal to a distributed communication network. The sweep signal is an RF signal that is swept from an initial frequency to a final frequency, e.g. 5 MHz to 82 MHz, in relatively small increments, e.g. 0.075 MHz. If an impedance mismatch exists within the network the impedance mismatch will reflect each transmitted signal back to the reflectometer at the same frequency as the transmitted signal, but retarded in phase. As a result of this reflection, a standing wave is generated. The reflectometer measures the level of the standing wave at each swept frequency in order to obtain a reflected sweep response signal. The retardation of the reflected sweep response signal is such that the minimums of the reflected wave will align to ½ the wavelength of the impedance mismatch from the reflectometer. Due to this known relationship, the reflectometer may determine the distance from the reflectometer to the impedance mismatch.

In order to fully characterize a home network for its ability to support triple play services and home networking standards such as Multimedia over Coax Alliance (MoCA) it is necessary to measure the frequency response from any node in the home network to any other node from 5 to 1500 MHz. Test instruments available today, which would allow a single technician to perform these tests, consist of a transmitting device and a separate receiving device (e.g., JDSU LST-1700). Characterization of a home network using such instruments is time consuming; therefore, there is a need to provide a more convenient and cost effective tool for home network characterization.

As Multiple System Operators (MSOs) and Telcos continue to add high bandwidth advanced services to their systems such as digital video, DOCSIS cable modems, switched digital video (SDV), and MoCA, the performance of coax and twisted-pair home network wiring becomes more critical. Given that most home network wiring was installed before the current bandwidth requirements were established, the performance of many home networks is marginal. This results in higher operator expense when installing and servicing triple-play services due to the increased technician troubleshooting time and cost of replacing entire home networks. In order to reduce these expenses, installers and service technicians need a tool that can fully map, troubleshoot, and qualify a home wiring network at the push of a button.

Accordingly, it is an object of this invention to provide a method of home network characterization and a system implementing this method which overcome the deficiencies of conventional network characterization systems and methods.

SUMMARY OF THE INVENTION

In accordance with the invention, a method of characterizing a wiring network having a nominal impedance is provided. The method includes connecting first and second probes to the wiring network at first and second different locations; at the first probe, generating a first RF signal and measuring a first reflected signal, wherein the first reflected signal is generated by the wiring network reflecting the first RF signal, and wherein an impedance of the second probe is equal to the nominal impedance; changing the impedance of the second probe between the nominal impedance and a mismatch impedance different from the nominal impedance; at the first probe, generating a second RF signal and measuring a second reflected signal, wherein the second reflected signal is generated by the wiring network reflecting the second RF signal, and wherein the impedance of the second probe is equal to the mismatch impedance; and, processing the first and second reflected signals so as to provide characterization of a transmission line between the first and second probes.

In accordance with one aspect of the invention a system for characterizing a wiring network is provided. The system includes a test controller, which in turn includes a user interface for receiving input from a user, and a controller processor for generating commands based on the input from the user. The system further includes a first probe including an RF transmitter for transmitting an RF signal into the wiring network in response to one of the commands from the test controller, a receiver for receiving a reflected signal from the wiring network, the reflected signal generated by the wiring network in response to the RF signal, and a measuring circuit for measuring the reflected signal so as to obtain measurements of the reflected signal. The system also includes a second probe including a receiver for receiving the commands from the test controller, and an impedance switch for changing an impedance of the second probe between a nominal impedance and a mismatch impedance different from the nominal impedance, in response to one of the commands from the test controller. The test controller is configured to command: the first probe to perform a first reflectometry test when the impedance of the second probe is equal to the nominal impedance, the second probe to change its impedance between the nominal impedance and the mismatch impedance, and the first probe to perform a second reflectometry test when the impedance of the second probe is equal to the mismatch impedance. The test controller is configured to process the measurements of the reflected signals obtained by the first probe in the first and second reflectometry tests so as to provide a characterization of the wiring network.

BRIEF DESCRIPTION OF THE DRAWINGS

The invention will be described in greater detail with reference to the accompanying drawings which represent preferred embodiments thereof, wherein.

DETAILED DESCRIPTION

The present invention will be apparent from the following detailed description, which proceeds with reference to the accompanying drawings, wherein same numerals refer to same elements.

The invention relates to reflectometry testing using probes with a remotely controlled impedance switch. Synchronization of the impedance switch and multiple measurements performed by a reflectometer-like device provides an opportunity to compare measurements taken when the probe has a nominal impedance of the wiring network with measurements taken after the impedance of the probe has been changed to a mismatch impedance. This allows the probe's reflection to be clearly identified within the reflectometer trace and thus enables an accurate distance measurement from the reflectometer to the probe. The two traces are compared, and the reflected pulse present only in the trace taken when the probe had the mismatch impedance is from the probe. As a result, a distance between two probes placed at two nodes within a wiring network, or a distance to a fault between the two probes may be determined using the reflectometry testing; in other words, the reflectometry testing allows for network characterization which generally includes measuring physical layer parameters such as length, attenuation, etc.

Figure 1:
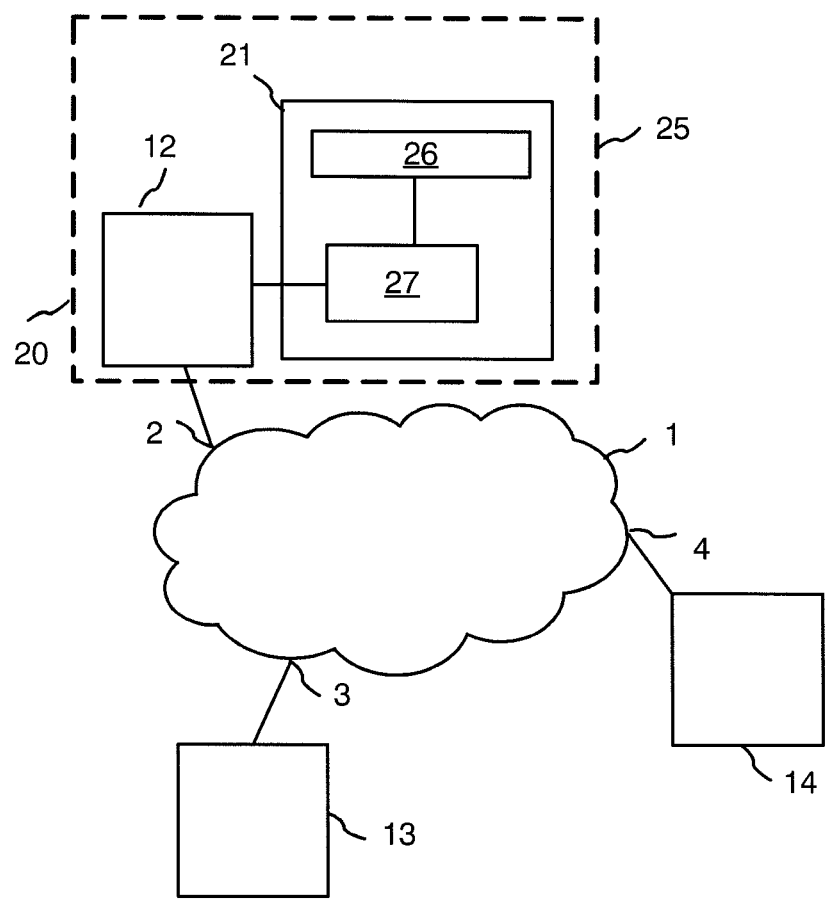
FIG. 1 illustrates a wiring network with probes connected to end points thereof.

With reference to FIG. 1, a system for characterizing a wiring network is designed for testing and characterizing a coax or twisted pair wiring network 1 in a single home, multiple dwelling units, or in a small-to-medium size business. The system 1 includes a test controller 21 and two or more probes 12 to 14 connected to the network 1 at different locations 2 to 4, respectively. At least some of the probes 12 to 14 have an impedance switch so as to change the impedance of the probe from the nominal impedance of the network 1 to a mismatch impedance different from the nominal impedance. Switching of an impedance and the entire testing procedure are controlled by the test controller 21.

At least one of the probes, for certainty the probe 12, has a capability of preforming reflectometry tests, which include generating an RF signal and measuring a reflected signal received from the wiring network 1. The reflectometry testing may use Frequency Domain Reflectometry (FDR) or Time Domain Reflectometry (TDR). The reflectometry tests are performed with the impedance values of other probes equal to the nominal impedance, and repeated with the impedance values of the other probes 13 and 14 changed to mismatch impedance values; preferably, one probe at a time. The mismatch impedance values may be same or different at the different probes. Additionally, the probes 13 and 14 can measure signals received from the network 1.

The measurements obtained by the probes 12 to 14 are reported to the test controller 21, which may reside together with one of the probes, e.g. the probe 12, within a casing 25 of a network tester 20. Alternatively, the test controller 21 may be implemented in a separate device such as a portable computer or a PDA. Hereafter, a probe residing within the tester 20 together with the test controller will be referred as a probe internal to the tester 20, and other probes as external probes.

The test controller 21 includes a user interface 26 for receiving input from a technician. The user interface 26 may include a keypad, a display for presenting information to the technician, a network interface for connecting to a remote device. The test controller 21 further includes a controller processor 27 for generating test commands based on the input from the technician, and a test command interface for providing the test commands to the external probes 13 and 14. The controller processor 27 is configured to command the probes 13 and 14 to change their impedances synchronously with reflectometry tests performed by the probe 12. The test controller 21 is also configured to process measurements received from the probes 12 to 14 so as to provide a characterization of the wiring network 1. In the network tester 20, the controller processor 27 may be a microprocessor used by the probe 12 and the test controller 21.

The probes 12 to 14 communicate with one another and with the test controller 21 either via the wiring network 1 or externally with respect to the network 1, e.g. wirelessly, using BlueTooth or ZigBee standard as described in U.S. Patent Application No. 20090135732 incorporated herein by reference. The test controller 21 includes an RF transmitter, wireless or otherwise, for transmitting commands to the external probes such as the probes 13 and 14. When the test controller 21 resides within the network tester 20, it communicates with the probe 12 using internal circuitry of the tester 20 or a connection like USB or RS-232. The test controller 21 may the same RF transmitter as the internal probe 12.

As discussed above, the probes 12 to 14 may include reflectometer capabilities and/or impedance switch. In one embodiment, an asymmetric system, only one probe, called a master probe, acts as a reflectometer; it does not need an impedance switch. In operation, the master probe is preferably connected upstream from all the slave probes. Other probes, called slave probes, are capable of switching their impedance in sync with the reflectometry tests. The slave probes generally possess no reflectometer capability and have a simple, cost-effective design. In another, symmetrical, embodiment of the system, all the probes have an impedance switch and can act as a reflectometer; this design provides more information about the wiring network. Generally speaking, a system may include more than one master probes, i.e. probes performing reflectometry testing, and more than one impedance switching slave probes.

Figure 2:
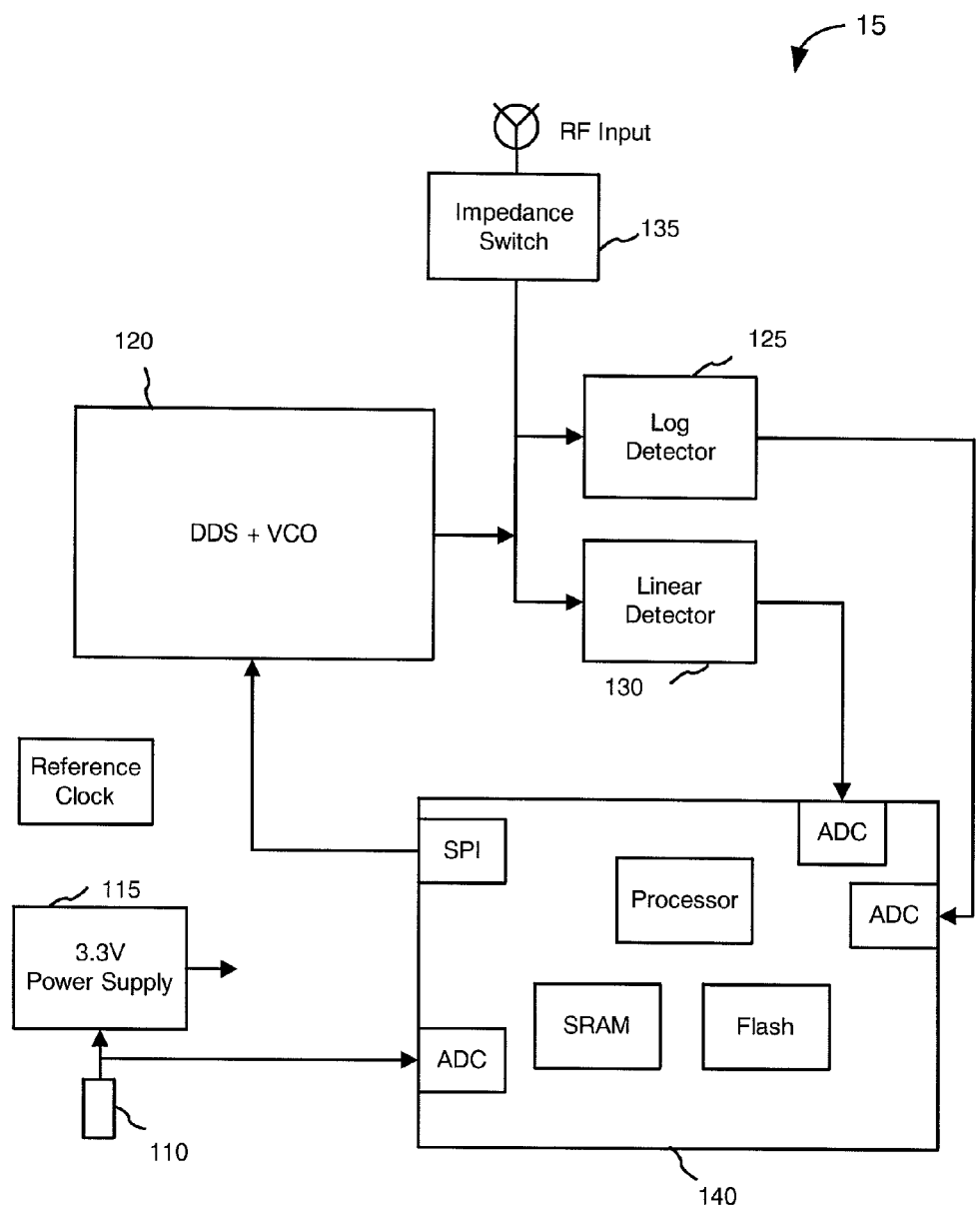
FIG. 2 is a schematic illustration of the probes of FIG. 1.

FIG. 2 illustrates one embodiment of a probe 15 designed for use in the symmetrical system for characterizing a wiring network 1. It has an impedance switch 135 and can perform reflectometry measurements; it can be used in place of any of the probes 12 to 14 shown in FIG. 1. The probe 15 is a low cost device including a Direct Digital Synthesize (DDS) and Voltage Controlled Oscillator (VCO) block 120, log detector 125, linear detector 130, impedance switch 135, microcontroller 140, power supply 115, and a battery 110.

The DDS+VCO block 120 is an RF transmitter 120 for transmitting RF signals within a range of frequencies for testing of the wiring network 1, such as Analog Devices AD9859 and Analog Devices ADF4350. In the probes 13 and 14 external to the network tester 20, the RF transmitter 120 may be used for reporting measurements to the test controller 21. By way of example, the DDS+VCO block 120 generates a sinewave between 0.5 to 1500 MHz, which is used as the source for frequency response and reflectometry measurements. In the network tester 20, the DDS+VCO block 120 may be used by both the probe 12 and the test controller 21. The test controller 21 uses the RF transmitter 120 for sending commands to the external probes 13 and 14 e.g. using off-keying (OOK) modulation; other modulation schemes such as ASK or FSK may be used.

The log detector 125 is a receiver 125 for receiving signals from the wiring network 1. The log detector 125 is used for calibrating the DDS+VCO block 120, receiving the frequency response sine wave transmitted from another probe, and acts as the telemetry receiver for receiving commands from the test controller 21 (FIG. 1). By way of example, the receiver 125 is Analog Devices ADL5513.

Finally, the linear detector 130 is a measuring circuit for measuring test signals, in particular, the FDR sinewave reflected from the network 1 and received by the receiver 125. By way of example, the measuring circuit is a half-wave diode detector circuit.

Figure 3:
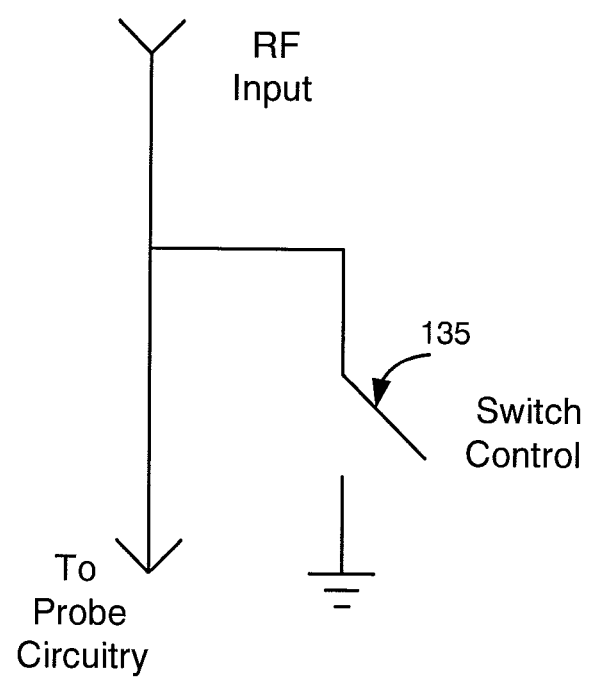
FIG. 3 is a schematic representation of an impedance switch.

The impedance switch 135 allows the input impedance of the probe 15 to be changed from a nominal value to a mismatch impedance value, which is different from the nominal value. By way of example, FIG. 3 illustrates an impedance switch 135 with a short. When the shorting switch is in the open position (as shown) the RF signal passes directly into the probe 15, which provides an impedance match of 75 ohms. When the shorting switch is in the closed position, the RF input is shorted directly to ground which provides an impedance mismatch of 0 ohms.

Figure 4:
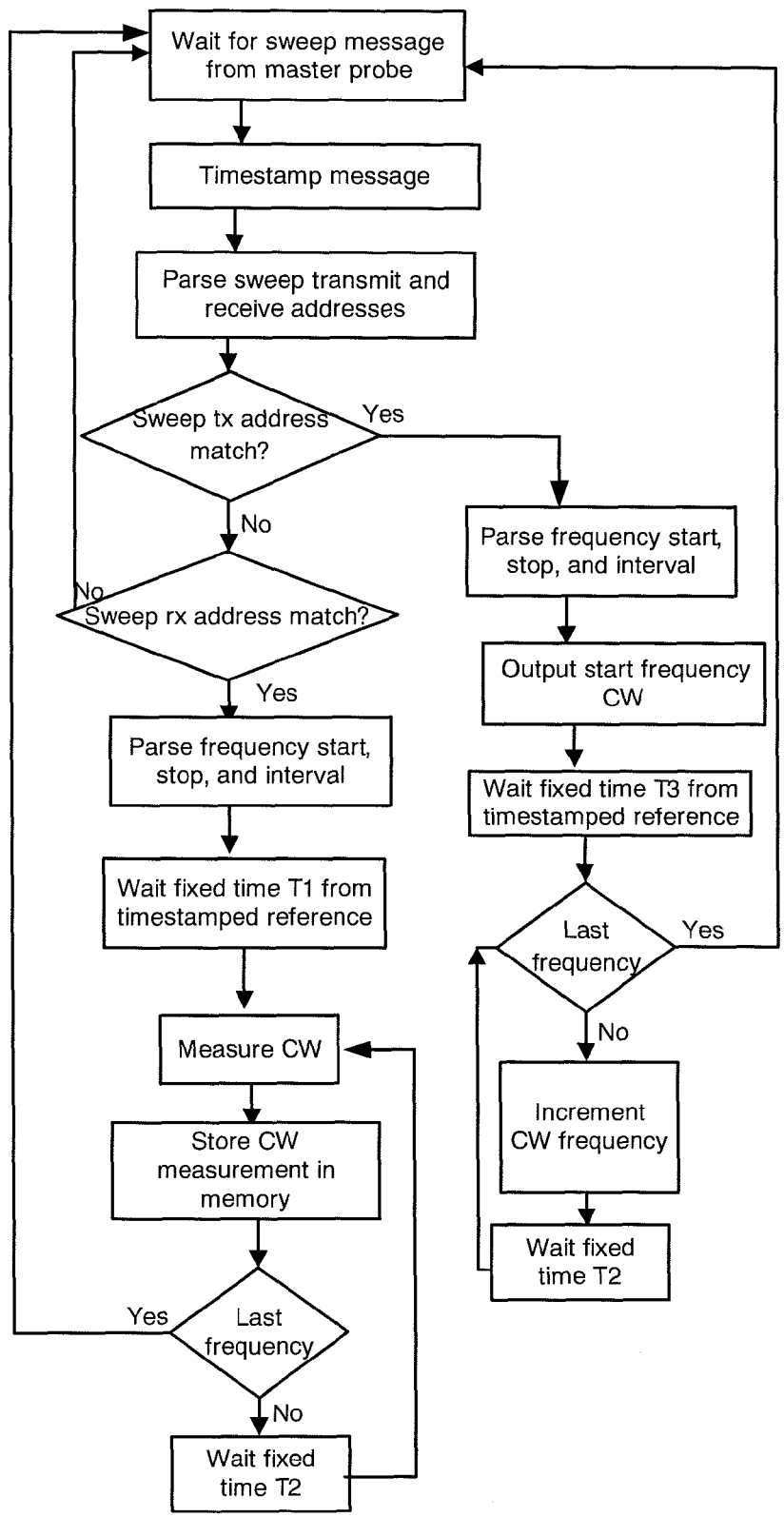
FIG. 4 is a flowchart of a response to a sweep message received at an external probe.
Figure 5:
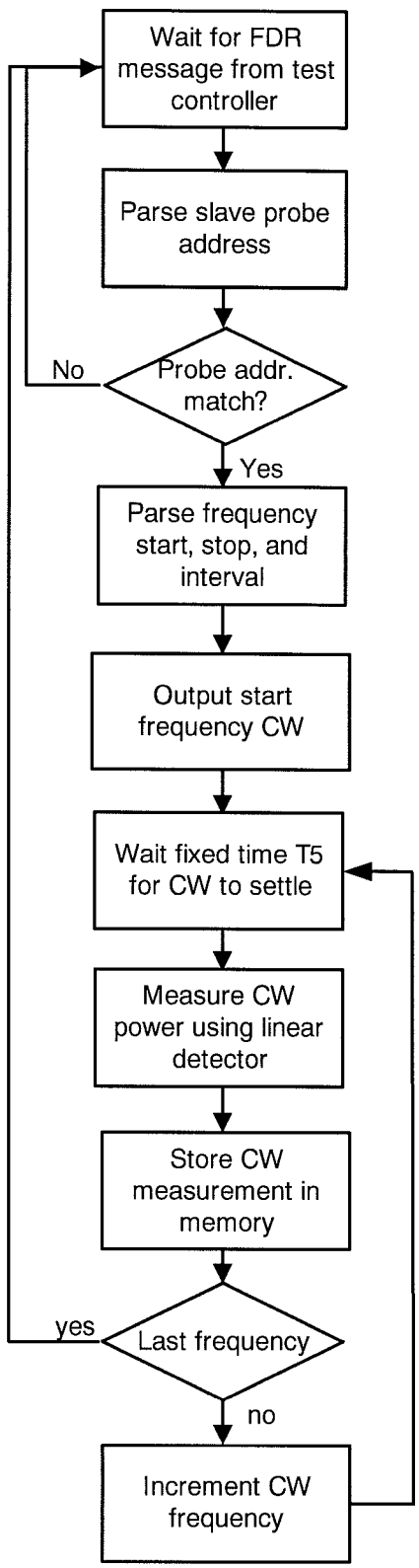
FIG. 5 is a flowchart of a response to an FDR sweep message received at an external probe.

A low cost microcontroller 140 implements measurement algorithms for performing measurements of the received signals; the algorithms are described further with reference to FIGS. 4 and 5. The microcontroller 140 also implements a telemetry protocol. When the probe 15 is an internal probe within the network tester 20, such as the probe 12, the telemetry protocol is used for sending commands from the test controller 21 to the external probes 13 and 14 and for receiving their responses. When the probe 15 is used as an external probe, such as the probe 13 or 14, RS-232 or USB protocol may be used for receiving commands from the test controller 21 and for sending probe's responses to the test controller 21.

Preferably, the probe 15 is capable of functioning as an FDR reflectometer. For this purpose, the microcontroller 140 is configured to command the RF transmitter block (DDS and VCO) 120 to generate a frequency sweep within a range of frequencies; the microcontroller 140 is also configured to command the measuring circuit 130 to measure a sweep response, wherein the sweep response is generated by the wiring network 1 reflecting the frequency sweep.

If the probe 15 is an internal probe of the network tester 20, the microcontroller 140 may be embodied in the controller processor 27, and the RF transmitter 120 and the receiver 125 may be shared by the probe 15 and the test controller 21.

In case the probe 15 is intended for use only as a master probe, it may lack the impedance switch 135. If the probe 15 is to be used as a slave probe, there is no need to implement the FDR algorithm. Preferably, the probe 15 includes both, the impedance switch 135 and the FDR capability.

Probes such as the probe 15 can be placed at any node within the home network 1 and commanded to measure frequency response between its node and any other node with a probe on it. In addition, the probe 15 can be commanded to shoot an FDR trace from its node or change its input impedance so that it shows up as a significant reflection on an FDR trace shot by a probe on any other node.

In order to characterize a home network 1 and map its topology, probes 15 are ideally placed at every node in the home network. In the event the network characterization system is asymmetrical, i.e. includes a master probe and slave probes, the master probe is placed upstream from all the slave probes, e.g. at a CATV tap or ground block. Preferably, the master probe is internal to the tester 20. The tester 20 communicates with all of the other probes, e.g. the probes 13 and 14, across the home network 1 using a telemetry signal modulated, for example, using Amplitude Shift Key (ASK), On/Off Key (OOK) or Frequency Shift Key (FSK) modulation scheme.

Figure 6:
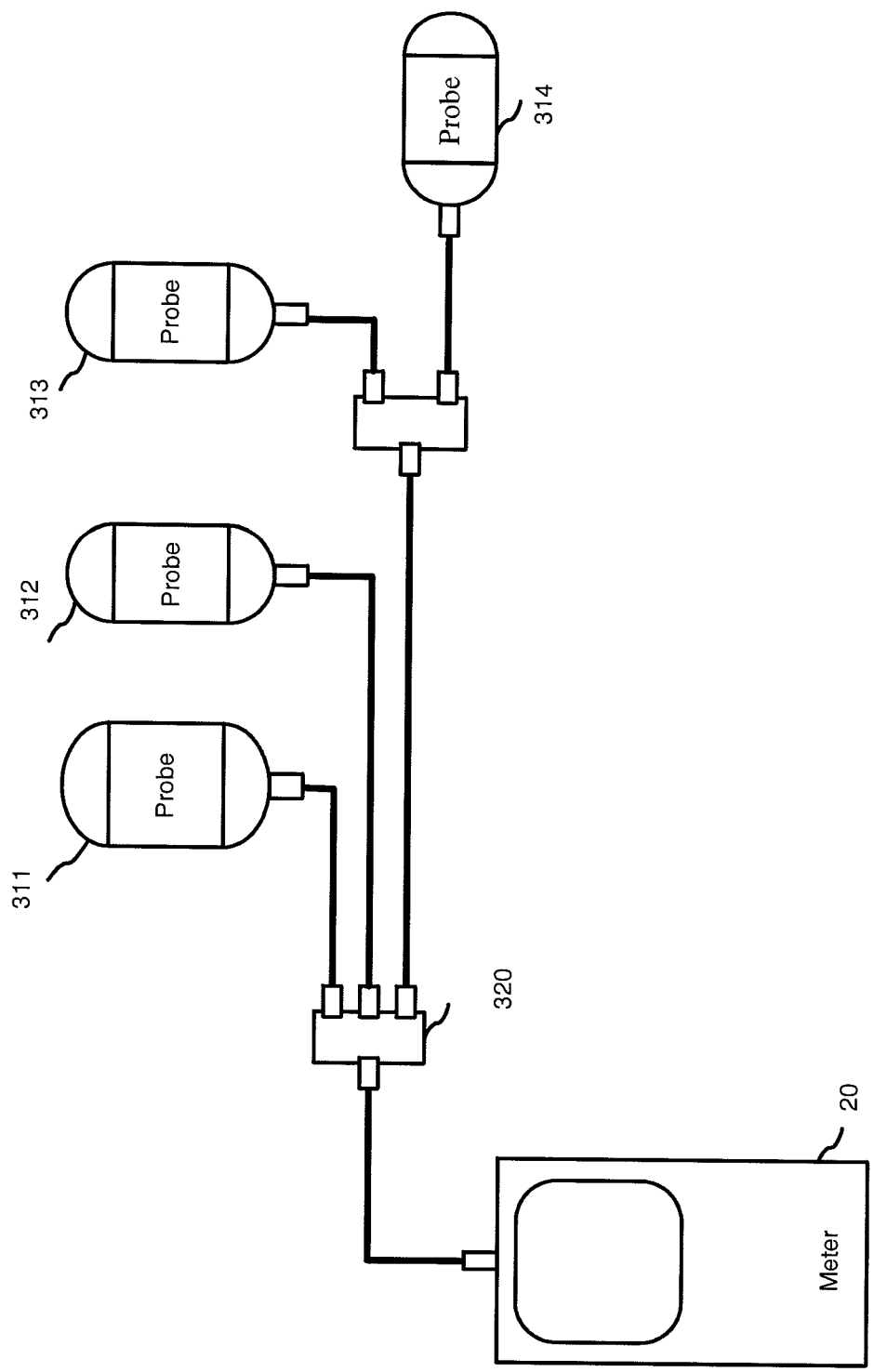
FIG. 6 is a schematic representation of an asymmetric system of this invention.

With reference to FIG. 6, an asymmetrical network characterization system includes the network tester 20 and slave probes 311-314; the network tester 20, which includes a master probe, is placed upstream from all the slave probes 311-314, e.g. at a CATV tap 320 or ground block.

Figure 7:
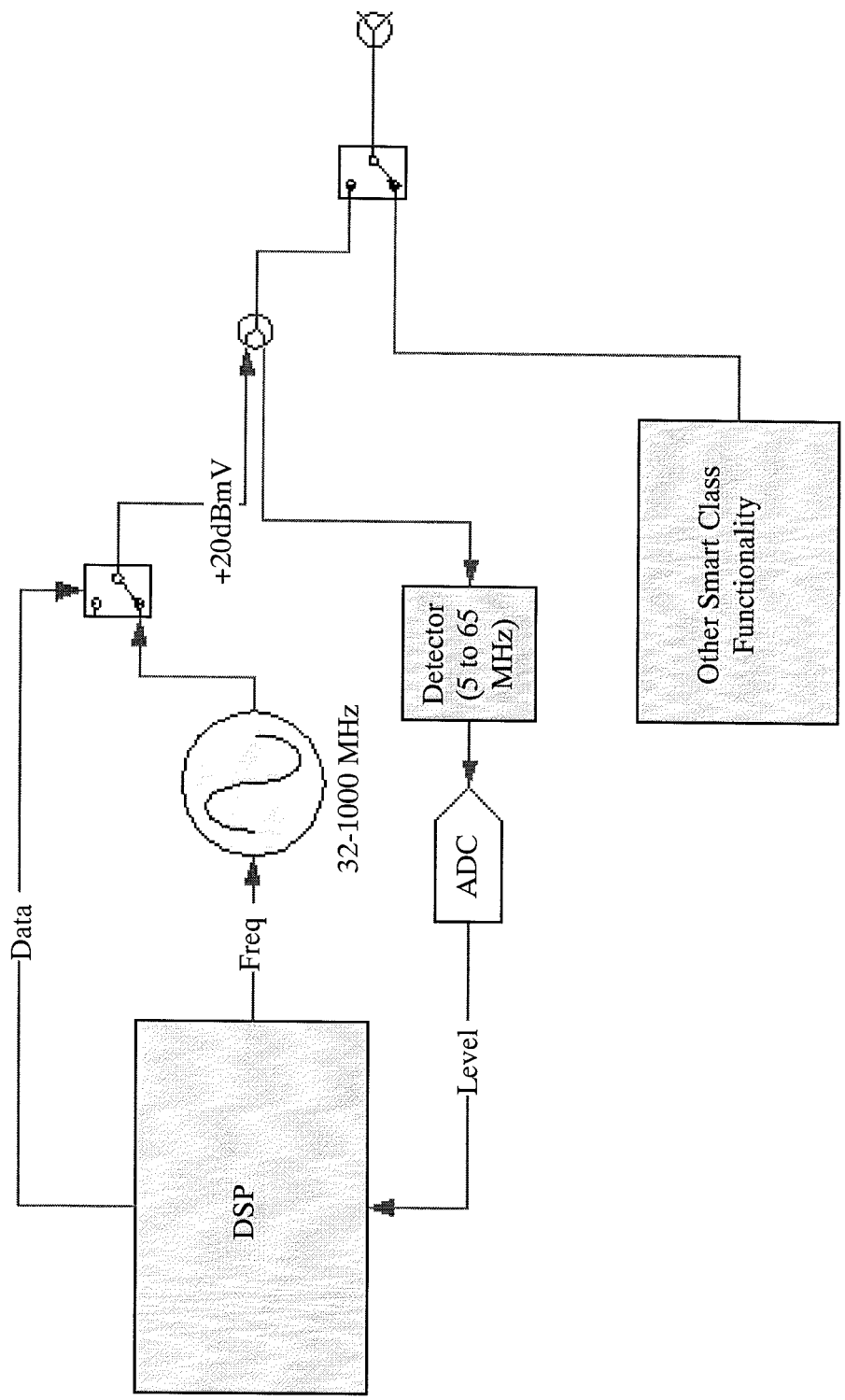
FIG. 7 is a schematic representation of one embodiment of a master probe.

FIG. 7 illustrates one embodiment of a network tester 20, which includes command generation and measurements processing. The tester 20 has a user interface (not shown), a downstream sweep transmitter and an upstream sweep receiver for measuring the quality of the connection. It also has a simple modem to control and get measurement data back from slave probes. The network tester may be built on the DSAM or Smart Class platform developed at JDSU.

Figure 8:
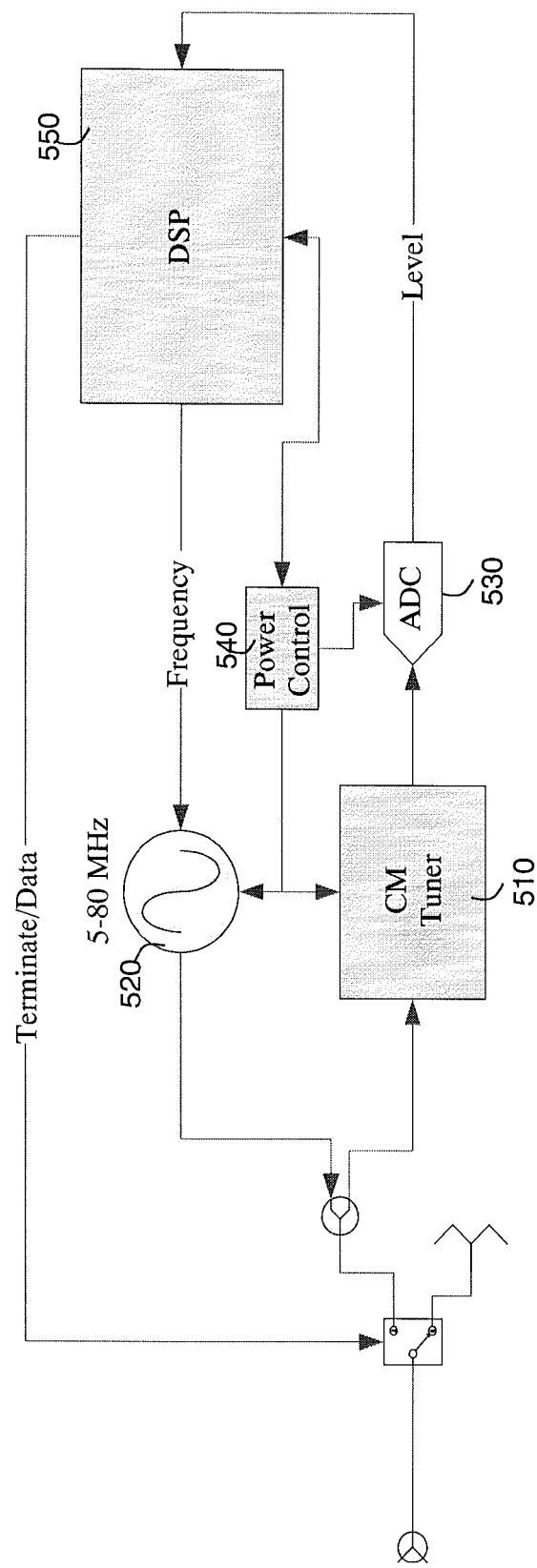
FIG. 8 is a schematic representation of a slave probe.

With reference to FIG. 8, a simple slave probe, such as the probes 311-314, includes a cable modem tuner 510 which can tune from 50 to 1000 MHz, a simple 5 to 80 MHz transmitter 520 and Analog-to-Digital Converter (ADC) 530 to measure signals, a power control 540 to extend battery life and a digital signal processor (DSP) 550 to coordinate and communicate with the network tester illustrated in FIG. 7.

By way of example, the network tester 20 and external probes 311-314 communicate as follows. The probes 311-314 work on a 1000 to 1 duty cycle to preserve battery power. About every one millisecond every second each probe 311-314 sends an "aloha" signal down (with an identifier) to the network tester 20, and then listens for a response. If the network tester 20 is busy or turned off, the probe gets no response and shuts down for the rest of the second. When the network tester 20 receives the "aloha" signal, it responds with the external probe's identifier. The network tester 20 may instruct the probe to wait until it hears from the network tester 20 again, or command the probe to do a specific task. If the network tester 20 has told the external probe to wait, the probe goes into a mode where it only listens to the downstream frequency for instructions for 10 milliseconds every 500 mSec. The network tester 20 is then expected to transmit a command for at least 500 mSec. If the network tester 20 doesn't get a response within several seconds, the network tester 20 will list that probe as a failed connection. If a collision between multiple probes happens, they will go into a random back-off time so as not to collide with each other a second time.

Prior to performing measurements, a user inputs test parameters such as a cable type used for calculation of a distance and expected loss, a tap value used to determine if the upstream loss combined with the tap loss is too great for a cable modem or set-top box to reach the headend with sufficient level. The input parameters may also include a drop level. If the network tester has a Signal Level Meter (SLM), it will record the level of real cable signals at the ground block. It will then use these values to predict where the levels will be at each of the outputs after the Composite Frequency Response is measured. If the tester doesn't have an SLM, the user will be able to preprogram the ground block level to be used for this test.

The wiring network characterization system allows performing an enhanced FDR test which uses the capability of the probes 311-314 to terminate and un-terminate the input by switching its impedance between the nominal and mismatch values. The master probe at the network tester 20 runs an FDR with all the probes terminated to determine where the splitters and poor impedance mismatches are. Then, the test controller 21 of the network tester 20 sequentially commands each of the probes 311-314 to un-terminate, so as to identify logical locations of each of the probes 311-314 in the home network and the distances between the network tester 20 and each of the probes 311-314. The enhanced FDR test is also described further with reference to FIG. 9.

During a composite downstream frequency response test, the master probe at the network tester 20 sends downstream a sweep signal, similar to the LST 1700 sweep. Each of the probes 311-314 measures and stores the frequency response for its point in the network. The network tester 20 then sequentially requests measurements from each of the probes 311-314. A composite plot of all the outlets is plotted and compared to a template response, to evaluate whether the frequency response is good enough to support the network. The composite plot shows which outlets perform normally and which outlets perform abnormally.

In a composite upstream frequency response test, the network tester 20 sequentially commands each of the probes 311-314 to send back an upstream sweep signal. The network tester 20 measures these along with the preprogrammed tap value to predict what level the cable modem or set-top will have to transmit to get back to the headend.

The use of a swept frequency response transmitted upstream to the network tester 20 from external probes 311-314 allows predicting whether the network is capable of supporting cable modems and other communication devices. Preferably, the probes 311-314 are capable of performing a sweep between slave probes. It allows for measuring the attenuation between probes, which is a critical parameter for the operation of MoCA.

Figure 9:
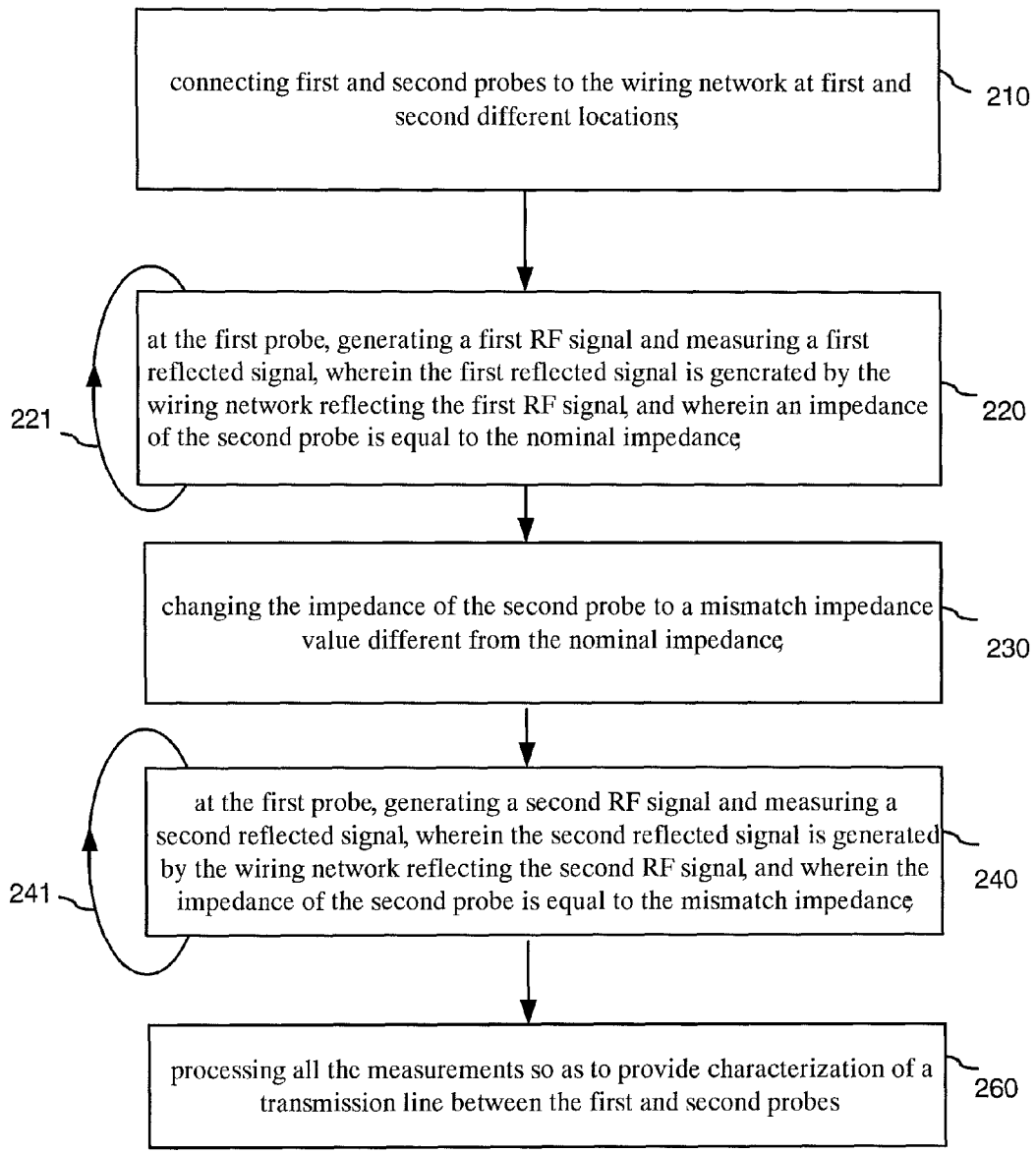
FIG. 9 is a flowchart of one embodiment of the method of this invention.

One embodiment of the method of this invention is described herein with reference to FIGS. 1 and 9.

At a connecting step 210, the first probe 12 and second probe 13 are connected to the wiring network 1 at first and second different locations 2 and 3, respectively.

In a first reflectometry step 220, a first RF signal is generated at the first probe 12 and a first reflected signal is measured at the first probe 12. The first reflected signal is generated by the wiring network 1 reflecting the first RF signal. The first reflectometry step 220 is performed when an impedance of the second probe 13 is equal to the nominal impedance of the wiring network 1.

In an impedance switch step 230, the impedance of the second probe 13 is changed between the nominal impedance and a mismatch impedance which is different from the nominal impedance by so as to make the second probe 13 "visible" in a second reflectometry step 240, wherein the first probe 12 generates a second RF signal and receives a second reflected signal, which is generated by the wiring network 1 reflecting the second RF signal. By way of example, the mismatch impedance may be 19 Ohms. In general, the greater the difference between the nominal and mismatch impedance, the further apart may be the probes while it is still possible to detect the probe with a mismatch impedance. If the distance between probes is only 10 feet, then the difference between the nominal and mismatch impedance may be only 5 Ohms. However, for 300 feet, the difference of 56 Ohms may be required. In other words, the mismatch impedance is at least by 5 Ohm different from the nominal impedance and preferably is made as high as technically possible. Differently from the first reflectometry step 220, in the second reflectometry step 240 the impedance of the second probe 13 is the mismatch impedance.

The order of the first and second reflectometry steps 220 and 240 may change with the only restriction that the impedance switch step 230, switching between the nominal and mismatch impedance, is executed between the two reflectometry steps 220 and 240.

In a measurements processing step 260, all the measurements obtained in the reflectometry steps 220 and 240 are processed at the test controller 21 so as to provide characterization of a transmission line between the first and second probes 12 and 13, respectively. The FDR trace with the nominal impedance is subtracted from the FDR trace with the mismatch impedance. In the resulting delta trace pulses above a certain threshold are identified and the distance between the probes is calculated as described in U.S. Pat. No. 5,994,905 incorporated herein by reference.

The first and second reflectometry steps 220 and 240 may be performed using an FDR or TDR technique.

In case the reflectometry measurements are performed using an FDR technique, the first reflectometry step 220 is repeated multiple times for a series of frequencies from a desired frequency range, by way of example from 0.5 to 1500 MHz. The same is true for the second reflectometry test 240. The optional repetitions of the steps 220 and 240 are schematically shown in FIG. 9 by arrows 221 and 241.

In other words, when the FDR technique is employed, the first reflectometry step 220 includes generating a first frequency sweep at the first probe 12 and measuring a first sweep response at the probe 13, wherein the first sweep response is generated by the wiring network reflecting the first frequency sweep and wherein the impedance of the second probe 13 is equal to the mismatch impedance; the second reflectometry step 240 includes generating a second frequency sweep at the first probe 12 and measuring a second sweep response at the probe 12, wherein the second sweep response is generated by the wiring network reflecting the second frequency sweep, and wherein the impedance of the second probe 13 is equal to the mismatch impedance; and, the measurements processing step 260 includes processing the first and second sweep responses so as to provide characterization of the transmission line between the first and second probes 12 and 13, respectively. Additionally, the second probe 13 may measure a first frequency response which is a first test frequency sweep transmitted from the first probe 12 and changed by the wiring network on transmission from the first probe 12 to the second probe 13, and the first probe 12 may measure a second frequency response, which is a second test frequency sweep transmitted from the second probe and changed by the wiring network on transmission from the second probe 13 to the first probe 12.

The FDR technique is described in more detail e.g. in U.S. Pat. No. 5,994,905, incorporated herein by reference.

The TDR method involves sending a single high speed pulse and is described e.g. in U.S. Pat. Nos. 7,276,913, 7,236,338 and 7,337,079, incorporated herein by reference.

FIG. 9 illustrates the embodiment of the method of this invention where the probe 12 is a master probe and the probe 13 is a slave probe. Alternatively, the method may be made symmetrical when the steps 220 to 240 are repeated, but the probe 13 acts as a master probe and the probe 12—as a slave probe.

Figure 10:
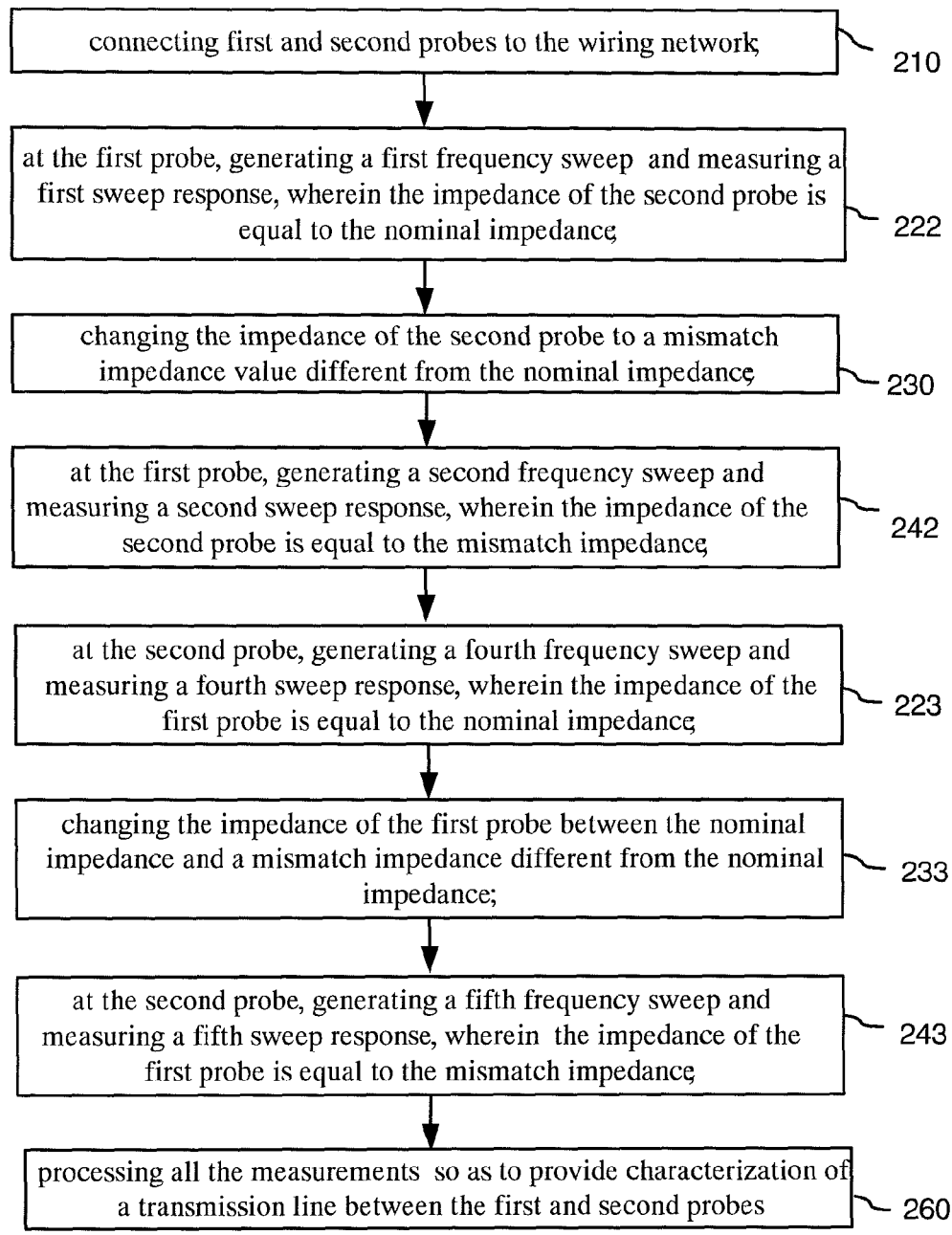
FIG. 10 is a flowchart of a symmetrical embodiment of the method of this invention.

With reference to FIG. 10, the symmetrical embodiment of the method includes the steps similar to the FDR version of the method shown in FIG. 9:

a first FDR step 222 performed at the first probe 12, generating a first frequency sweep including the first RF signal and measuring a first sweep response including the first reflected signal, wherein the first sweep response is generated by the wiring network reflecting the first frequency sweep, and wherein the impedance of the second probe is equal to the nominal impedance;

an impedance switch step 230, changing the impedance of the second probe to a mismatch impedance value different from the nominal impedance;

a second FDR step 242 performed at the first probe, generating a second frequency sweep including the second RF signal and measuring a second sweep response including the second reflected signal, wherein the second sweep response is generated by the wiring network reflecting the second frequency sweep, and wherein the impedance of the second probe is equal to the mismatch impedance;

The symmetrical method illustrated by FIG. 10 further includes:

a first symmetrical FDR step 223 performed at the second probe, generating a fourth frequency sweep and measuring a fourth sweep response, wherein the fourth sweep response is generated by the wiring network reflecting the fourth frequency sweep, and wherein the impedance of the first probe is equal to the nominal impedance;

a symmetrical impedance switch step 233, changing the impedance of the first probe between the nominal impedance and a mismatch impedance different from the nominal impedance;

a second symmetrical FDR step 243 performed at the second probe, generating a fifth frequency sweep and measuring a fifth sweep response, wherein the fifth sweep response is generated by the wiring network reflecting the fifth frequency sweep, and wherein the impedance of the first probe is equal to the mismatch impedance; and, finally, the measurements processing step 260, wherein all the measurements are processed so as to provide characterization of a transmission line between the first and second probes 12 and 13, respectively.

Although the method of this invention has been described above as executed using two probes, it is more practical to use many (more than two) probes, ideally a probe in each node of the wiring network. Preferably, one of the probes is within the network tester 20 connected to the network upstream to all other probes. In case of three probes, the symmetrical embodiment of the method includes, for each of the probes, changing the impedance of the probe between the nominal impedance and a mismatch impedance different from the nominal impedance and performing frequency sweeps by each of the two other probes before and after the changing of the impedance, all the operation performed on commands from the test controller received by external probes in the form of messages. FIG. 5 is a flowchart of a response to an FDR sweep message received at one of the external probes. After receiving the FDR sweep message, this probe performs an FDR sweep as commanded and reports measurements of the reflected signal to the tester 20. Notably, the test controller 21 synchronizes FDR messages and messages to other probes requesting an impedance change.

With reference to FIG. 6, in a network having more than two probes, the network tester 20 shoots an FDR trace into the network to get a baseline trace. Next, the test controller 21 commands one probe at a time to change its input impedance from the nominal value and then the master probe shoots another FDR trace. This allows the test controller 21 to determine the exact distance from the tester 20 to each of the probes 311-314. The entire process is repeated with each probe 311-314 shooting an FDR trace while other probes have their input impedances changed from the nominal, preferably one at a time. All the FDR traces are uploaded to the test controller 21 via telemetry and correlated with each other to generate higher resolution, longer range FDR traces which can be used along with the node-to-node frequency responses to generate a topology map of the home network which shows network components (splitters, amplifiers, cable leg lengths, etc.) and impairments.

Figure 11:
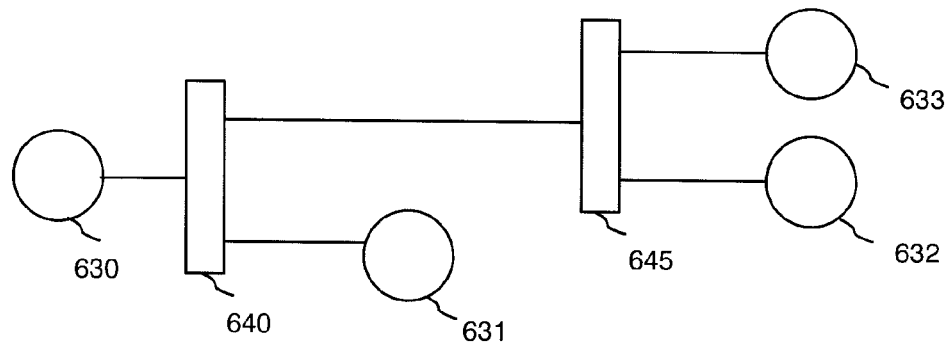
FIG. 11 is a schematic representation of a simple home network.
Figure 12:
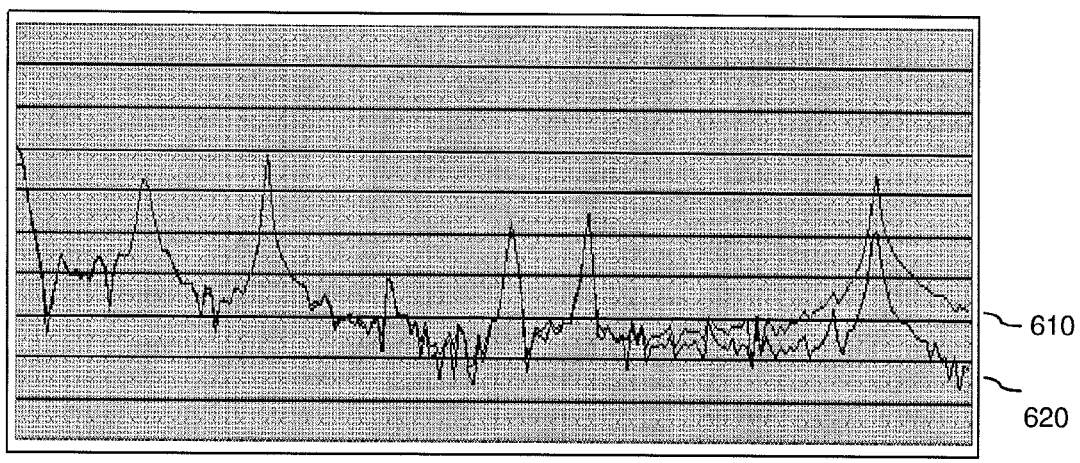
FIG. 12 is a plot of two FDR traces shot by a master probe in the network shown in FIG. 11.

By way of example, FIG. 11 shows a simple home network with two splitters 640 and 645, one master probe 630, and three slave probes 631-633. The diagram in FIG. 12 shows two FDR traces shot by the master probe. The first trace 620 is with the impedance of all the remote probes set to 75 ohms. The second trace 610 is the case where the impedance of the remote probe 633 is a short but the other probes are matching. One can see from comparing the two traces that the last major reflection is from probe 633.

By way of example, the splitter 640 may be identified as follows. Reflection from the splitter 640 is seen by at least two probes 633 and 631, thus identifying it as some type of a splitter. To further determine the type of the splitter 640, the sweep data at 2 MHz between probes 630 and 631 may be used to determine the insertion loss of the splitter (at 2 MHz the attenuation due to the cable is negligible so the only loss comes from the splitter). In this case the attenuation is expected to be between 3.5 and 4 dB which would give us confidence that it is a 2-way splitter. If the loss were greater, the splitter 640 may be e.g. a 3-way splitter or a 4-way splitter. Accordingly, using three probes allows identifying a two-way splitter with 99% confidence, whereas measurements performed between two probes, e.g. the probes 630 and 631 would only indicate presence of a network element, which may or may not be a splitter.

Although the enhanced reflectometry technique described above provides logical mapping of the wiring network, generally speaking, it does not answer the question whether the attenuation of the signals in the wiring network is low enough in every direction so as to satisfy the requirements of service providers. Accordingly, the reflectometry testing is preferably accompanied by frequency response testing.

Between the first and second probes 12 and 13, a response signal is measured at the second probe 13; the response signal is generated by the wiring network 1 on transmission from the first probe 12 to the second probe 13 of a signal generated at the first probe 12. In other words, the wiring network 1 transmits and attenuates a signal transmitted from the first probe 12 thus generating the response signal measured in the frequency response test.

The frequency response test may be performed concurrently with the first reflectometry step 220 (FIG. 9) so that a reflected component of the first RF signal is measured at the first probe 12 and a transmitted component is measured at the second probe 13.

In order to measure the frequency response of the wiring network 1, the test controller 21 commands the first probe 12 to transmit a sinewave, also referred to as a continuous wave (CW), at a specific frequency while the second probe 13 is commanded to measure the power of the received signal. The power measurements are then uploaded from the second probe 13, e.g. via telemetry, to the test controller 21, and the process is repeated for all frequencies within a desired band. The result is that the frequency response of the link connecting the first and second probes, 12 and 13 respectively, is measured and uploaded to the tester 20. FIG. 4 provides an exemplary algorithm executed at the second probe 13 during the frequency response sweep.

The second probe 13 is normally in a standby mode waiting for a telemetry message. If the probe 13 is to act as a sweep receiver, it receives a broadcast sweep message from the master probe which includes the address of the probe 13 in the sweep receive probe address field of the message; there may be multiple probe addresses in this field. Upon receipt of the massage, the probe 13 timestamps it and checks the sweep transmit probe address field for a match. If the address match check fails, the probe 13 checks for a match with the sweep receive probe address field. If the match is found, the probe proceeds to parse the sweep start frequency, stop frequency, and step frequency interval from the message. Then it waits a fixed time T1 from the timestamped reference time for the designated sweep transmitter probe to output and stabilize the first CW signal at the specified start frequency. Then the probe 13 measures the CW power level and stores it in memory. If the current frequency equals the stop frequency then probe 13 goes back to the standby mode and waits for the next telemetry message. Otherwise it waits a fixed time T2 for the sweep transmitter probe to output the next CW at a frequency equal to the current frequency plus the frequency step interval. Then it repeats the above steps until the CWs of all frequencies have been measured.

When the probe 13 is to act as a sweep transmitter, it waits in standby mode until it receives a broadcast sweep message from the master probe which includes its address in the sweep transmit probe address field of the message. The probe 13 timestamps the message upon receipt and checks the sweep transmit probe address field for a match. If it matches, the probe proceeds to parse the sweep start frequency, stop frequency, and step frequency interval from the message. Then, it immediately outputs a CW signal at the specified start frequency and waits a fixed time T3 for the sweep receiver probes to measure the CW power. If the current frequency equals the last frequency then the probe goes back to standby mode and waits for the next telemetry message. Otherwise it outputs the next CW at a frequency equal to the current frequency plus the frequency step interval and waits a fixed time interval T2 for the sweep receiver probes to measure its power. It repeats the above steps until the CWs of all frequencies have been output.

Additionally, in the symmetrical embodiment of the method, the frequency response tests are performed in both directions along the same link. With reference to FIG. 1, the symmetrical embodiment of the method includes reflectometry testing, e.g. FDR sweep, performed by each of the probes 12, 13, and 14. When, for example, the test controller 21 commands the probe 13 to perform an FDR sweep, it also commands the probes 12 and 14 to switch their impedance to mismatch value(s), preferably one probe at a time. During the frequency response testing, each of the probes generate a signal and one or more other probes measure this signal and report the measurements to the test controller 21.

In a system with more than two probes, the test controller 21 commands one probe at a time to transmit a sinewave at a specific frequency while the other probes are commanded to measure the power of the received signal. The power measurements are then uploaded from each probe via telemetry to the test controller 21, and the process is repeated for all frequencies within a desired band. This entire process is repeated until each probe, including the probe 12 at the tester 20, has acted as a sinewave source. The result is that the frequency response from any node to any other node is measured and uploaded to the tester 20.

The frequency response measurements are preferably symmetric. For example, at first the probe 13 generates a sinewave signal and the probe 14 measures the received signal and reports it to the test controller 21, and then the probe 14 generates a sinewave signal and the probe 13 measures the corresponding received signal and reports it to the test controller 21. In the event the measurements in different directions over a same link are significantly different, this may indicate presence of an amplifier. When frequency response testing is asymmetric, an amplifier may be detected if the attenuation is less than expected.

In one embodiment of this invention, a probe contains both a sweep transmitter and sweep receiver that allows high speed frequency response testing between any two nodes in a home wiring network.

In one embodiment of this invention, a probe contains an impedance mismatch switch which allows the probe to be identified within an FDR or TDR trace.

In one embodiment of this invention, a probe contains either FDR or TDR capability that can be used to detect impairments in a home wiring network. The FDR/TDR trace from multiple probes is combined to enhance the FDR measurement range and resolution.

The invention includes using frequency responses, FDR/TDR traces, and probe impedance mismatches measured using probes attached to some or all of the nodes of a home network to generate a map of the home wiring network.

Advantageously, the method of this invention provides information about logical location and quality of outlets in a wiring network. This reduces the number of multiple technician's visits to a particular customer location and thus reduces the cost of installation and maintenance of the wiring network, by e.g. Internet Service Providers (ISPs).

In addition to home network characterization and mapping, a meter/master probe may be used from any node along with one or more slave probes placed at any other node (including upstream nodes such as the ground block) to troubleshoot impairments between specific nodes.

Finally, the probe hardware is capable of using its DDS+VCO block to generate a tagged leakage or toner signal which can be used for locating RF leaks and tracing cable routes.

According to the invention, features described in one embodiment thereof may be incorporated into other embodiments.

We claim:
1. A method of characterizing a wiring network having a nominal impedance, comprising:
connecting first and second probes to the wiring network at first and second different locations;
at the first probe, generating a first frequency sweep and measuring a first sweep response generated by the wir- ing network reflecting the first frequency sweep, wherein an impedance of the second probe is equal to the nominal impedance;

changing the impedance of the second probe between the nominal impedance and a mismatch impedance different from the nominal impedance;

at the first probe, generating a second frequency sweep and measuring a second sweep response generated by the wiring network reflecting the second frequency sweep, wherein the impedance of the second probe is equal to the mismatch impedance;

at the second probe, generating a third frequency sweep and measuring a third sweep response generated by the wiring network reflecting the third frequency sweep, and wherein the impedance of the first probe is equal to the nominal impedance;

changing the impedance of the first probe between the nominal impedance and a mismatch impedance different from the nominal impedance;

at the second probe, generating a fourth frequency sweep and measuring a fourth sweep response generated by the wiring network reflecting the fourth frequency sweep, and wherein the impedance of the first probe is equal to the mismatch impedance; and, processing the first, second, third, and fourth sweep responses so as to provide characterization of a transmission line between the first and second probes.

2. A method as defined in claim 1 comprising:
connecting a third probe to the wiring network at a third location different from the first and second locations;
changing an impedance of the third probe between the nominal impedance and a mismatch impedance different from the nominal impedance;
at the first probe, generating two RF signals, one before and another after the changing the impedance of the third probe, and measuring two reflected signals generated by the wiring network reflecting the two RF signals.

3. A method as defined in claim 2 comprising, for each of the first, second, and third probes, changing the impedance of the probe between the nominal impedance and a mismatch impedance different from the nominal impedance and performing frequency sweeps by each of the two other probes before and after the changing of the impedance.

4. A method as defined in claim 1 further comprising:
at the second probe, measuring a first frequency response, wherein the first frequency response is a first test frequency sweep transmitted from the first probe and changed by the wiring network on transmission from the first probe to the second probe.

5. A method as defined in claim 4 further comprising:
at the first probe, measuring a second frequency response, wherein the second frequency response is a second test frequency sweep transmitted from the second probe and changed by the wiring network on transmission from the second probe to the first probe.

6. A method as defined in claim 1 wherein the characterization of the transmission line between the first and second probes includes a distance between the first and second probes.

7. A system for characterizing a wiring network, the system comprising:
a test controller comprising:
a user interface for receiving input from a user, and
a controller processor for generating commands based on the input from the user;
a first probe comprising:
an RF transmitter for transmitting an RF signal into the wiring network in response to one of the commands from the test controller,
a receiver for receiving a reflected signal from the wiring network, the reflected signal generated by the wiring network in response to the RF signal, and
a measuring circuit for measuring the reflected signal so as to obtain measurements of the reflected signal; and,
a second probe external to the test controller, comprising:
an RF transmitter for transmitting an RF signal into the wiring network in response to one of the commands from the test controller,
a receiver for receiving the commands from the test controller, and
an impedance switch for changing an impedance of the second probe between a nominal impedance and a mismatch impedance different from the nominal impedance, in response to one of the commands from the test controller;
wherein the test controller is configured to command:
the first probe to perform a first reflectometry test when the impedance of the second probe is equal to the nominal impedance,
the second probe to change its impedance between the nominal impedance and the mismatch impedance, and
the first probe to perform a second reflectometry test when the impedance of the second probe is equal to the mismatch impedance; and,
wherein the test controller is configured to process the measurements of the reflected signals obtained by the first probe in the first and second reflectometry tests so as to provide a characterization of the wiring network.

8. A system as defined in claim 7 wherein the first probe comprises an impedance switch for changing an impedance of the first probe between the nominal impedance and a mismatch impedance different from the nominal, and the second probe comprises a receiver for receiving reflected signals from the wiring network.

9. A system as defined in claim 7 comprising a network tester comprising a casing, the first probe, and the test controller, wherein the first probe and the test controller are within the casing.

10. A system as defined in claim 7 further comprising a third probe, wherein the test controller includes instructions for identifying a three-way splitter if the first probe is connected to an input port of the three-way splitter and second and third probes are connected to two output ports of the three-way splitter.

11. A system as defined in claim 7 wherein the first probe is configured to generate a frequency sweep including the RF signal and to measure a sweep response including the reflected signal, wherein the sweep response is generated by the wiring network reflecting the frequency sweep.

12. A system as defined in claim 7 wherein the second probe comprises a measuring circuit for measuring a first test signal transmitted from the first probe so as to obtain first test measurements, and wherein the test controller is configured to command the first probe to transmit the first test signal into the wiring network and the second probe to measure the first test signal received from the wiring network and to report the first test measurements to the test controller.

13. A system as defined in claim 12 wherein the first probe comprises a measuring circuit for measuring a second test signal transmitted from the second probe so as to obtain second test measurements, and wherein the test controller is configured to command the second probe to transmit a second test signal into the wiring network and the first probe to measure the second test signal received from the wiring network and to report the second test measurements to the test controller.

* * * * *